United States Patent [19]

Liaw et al.

[11] Patent Number: 5,712,202
[45] Date of Patent: Jan. 27, 1998

[54] METHOD FOR FABRICATING A MULTIPLE WALLED CROWN CAPACITOR OF A SEMICONDUCTOR DEVICE

[75] Inventors: Ing-Ruey Liaw, Chutung; Meng-Jaw Cherng, Shung Hsi, both of Taiwan

[73] Assignee: Vanguard International Semiconductor Corporation, Hsin-Chu, Taiwan

[21] Appl. No.: 578,928

[22] Filed: Dec. 27, 1995

[51] Int. Cl.⁶ .................................... H01L 21/8242
[52] U.S. Cl. .................... 438/253; 438/255; 438/396; 438/398; 148/DIG. 14
[58] Field of Search .................... 438/253, 254, 438/255, 381, 396, 397, 398; 148/DIG. 14

[56] References Cited

U.S. PATENT DOCUMENTS

| | | | |
|---|---|---|---|
| 5,330,614 | 7/1994 | Ahn | 437/915 |
| 5,372,965 | 12/1994 | Ryou | 437/52 |
| 5,380,673 | 1/1995 | Yang et al. | 437/47 |
| 5,389,560 | 2/1995 | Park | 437/52 |
| 5,389,568 | 2/1995 | Yun | 437/60 |
| 5,399,518 | 3/1995 | Sim et al. | 437/52 |

*Primary Examiner*—Tuan H. Nguyen
*Attorney, Agent, or Firm*—George O. Saile; Stephen B. Ackerman; William J. Stoffel

[57] ABSTRACT

A method of fabricating double and multi-cylindrical storage capacitors is provided. To form a double crown capacitor, a conductive layer is formed on a multi-layer gate and insulation structure. The conductive layer includes a portion extending through a contact hole provided in the underlying insulation structure to thereby electrically connect the conductive layer with an active region of a transistor. A groove is formed in the conductive layer defining an area for a plurality of separated electrodes. First spacers are formed on the side walls of the groove. Then, the conductive layer is anisotrophically etched using the spacers as an etch mask thus forming an annular ridge around the area where the memory device is formed. The first spacers are then removed. Second and third spacers are then formed on the both sidewalls of the annular ridge. Again, the conductive layer is anisotrophically etched using the second and third spacers as an etch mask thus forming a double crown electrode from the remaining conductive layers under the second/third spacers. A capacitor dielectric layer and a top plate electrode layer are formed over the crown electrodes to complete the capacitor. The process of forming spacers on the sidewalls of the groove and on the annular ridge can be repeated to form multi-cylindrical (three or more walls) capacitors.

13 Claims, 8 Drawing Sheets

METHOD FOR FABRICATING A MULTIPLE WALLED CROWN CAPACITOR OF A SEMICONDUCTOR DEVICE

BACKGROUND OF INVENTION

1) Field of the Invention

The present invention relates generally to fabrication of crown capacitors in a semiconductor memory device and more particularly to a method for fabricating a highly integrated semiconductor memory having a double-cylindrical or multi-cylindrical storage electrode for high reliability and large cell capacitance for memory cells.

2) Description of the Prior Art

Dynamic random access memories (DRAMs) have a plurality of memory cells, each of which generally includes a storage capacitor and a transistor serving as a transfer gate for storing or eliminating charges. The plurality of memory cells are arranged on a substrate in a matrix arrangement and operate to permit only a single cell in the memory to be selected by means of two dimensional addressing within a given time period. A bit line (data line) voltage is supplied to the storage capacitor via a transistor so as to write information on each memory cell. Also, in order to read out the written information, the storage capacitor is connected to the data line via a gate and the voltage of the storage capacitor is thus monitored.

A serious obstacle to increasing packing density in dynamic random access memories (DRAMs) is the decrease in cell capacitance caused by reduced memory cell area. The problem of decreased cell capacitance must be solved to achieve higher packing density in a semiconductor memory device, since decreased cell capacitance degrades read-out capability and increases the soft error rate of the memory cell as well as consumes excessive power during low-voltage operation by impeding device operation.

Generally, in a 64 MB DRAM having a 1.5 µm$^2$ memory cell area employing an ordinary two dimensional stacked capacitor cell, sufficient cell capacitance cannot be obtained even though a higher dielectric constant material, e.g., tantalum oxide (Ta$_2$O$_5$), is used. Therefore, capacitors having a three-dimensional structure have been suggested to improve cell capacitance. Such capacitor include, for example double-stacked, fin-structured, cylindrical, spread-stacked, and box structured capacitors.

Since both outer and inner surfaces can be utilized as an effective capacitor area, the cylindrical structure is favorably suitable to the three-dimensional stacked capacitor, and is more particularly suitable for an integrated memory cell which is 64 Mb or higher. Also, an improve stacked capacitor has recently been presented, where pillars or another inner cylinder is formed in the interior of the cylinder. Not only may both of the inner and outer surfaces of the cylinder be utilized as the effective capacitor area, but also the outer surface of the pillars or the inner cylinder formed in the interior of the cylinder.

The following U.S. patents show related processes and capacitor structures: U.S. Pat. No. 5,399,518, Sim et at.; U.S. Pat. No. 5,389,568, Yun; U.S. Pat. No. 5,389,560, Park; U.S. Pat. No. 5,380,673, Yang; U.S. Pat. No. 5,372,965, Ryou. Many of the prior art methods require substantially more processing steps or/and planar structures that make the manufacturing process more complex and costly. For example, U.S. Pat. No. 5,399,518 to Sim teaches a method of forming a double-cylindrical storage electrode of a capacitor. The method begins by forming an oxide cylinder on a polysilicon layer. Next, first (oxide) and second spacers are formed on the sidewalls of the oxide cylinder. The uncovered areas of the polysilicon layer are etched to define electrodes. A second etch is used to etch out an insulation layer beneath the electrode. Next, the oxide cylinder and the second spacer are removed leaving the first silicon nitride spacer on the electrode top surface. Using the nitride spacer as a mask, top portions of the electrode are removed forming a cylindrical upward stepped portion on the electrode surface. Third spacers are formed on both sides of the upward stepped portion. Using the third spaces as a mash the electrode is etched forming, under the third spacers, the two crowns of the double cylindrical electrode. However, this method could be improved upon by reducing the number of process steps. This method has the disadvantage of the extra process steps in forming an oxide cylinder and the first and second spacers. Moreover, two etch steps are required just to define the individual electrodes. Overall, the method of Sim could be improved if a method were invented that did not require an oxide cylinder and three sets of spacers to define a double crown and that did not require two etches just to define the individual electrodes.

There is a challenge to develop methods of manufacturing crown capacitors that minimize the manufacturing costs and maximize the device yields. In particular, there is a challenge to develop a method which minimizes the number of process steps and provide maximum process tolerance to maximize product yields. There is also a challenge to develop a crown capacitor with two or more than two plates which is easy to manufacture.

SUMMARY OF THE INVENTION

It is an object of the present invention to provide a novel method for fabricating a double or triple or higher walled-cylindrical capacitor of a semiconductor memory device, which ensures high reliability and large cell capacitance of the memory device.

It is another object of the present invention to provide a novel method for fabricating a multi-cylindrical capacitor of a semiconductor memory device, which uses a minimum number of process steps and has a wide process tolerance.

It is another object of the present invention to provide a method for fabricating a two or more vertical crowns of a multi-cylindrical capacitor of a semiconductor memory device, which is easy to manufacture, inexpensive to manufacture and uses a minimum number of masking operations.

To accomplish the above objectives, the present invention provides a method of manufacturing a double-cylindrical, a triple cylindrical or more multi cylindrical capacitor for a DRAM. The process of the invention to form a double cylindrical capacitor is characterized in that after forming a conductive layer over associated field effect transistors, a groove is etched in the conductive layer. The annular groove encompasses the area which will be removed to define and separate adjacent crown electrodes. First spacers are formed on the sidewalls of the groove. Next, the conductive layer is anisotrophically etched using the first spacer as an etch mask thus forming an annular ridge around the areas where the electrodes will be formed. The first spacers are then removed. Second and third spacers are then formed on the both sidewalls of the annular ridge. The conductive layer is anisotrophically etched using the second and third spacers as an etch mask thus forming a double crown electrode from the remaining conductive layer under the second/third spacers. Also, the anisotropic etch removes all the polysilicon under the groove thereby separating the adjacent electrodes.

A capacitor dielectric layer and a top plate electrode layer are formed over the crown electrode to complete the capacitor.

In another embodiment of the present invention, a triple crown capacitor is formed by using adding on the process of the double crown capacitor (explained above) by forming an additional set of spacers (fourth, fifth and sixth) which are used to define three upright crowns. The triple crown capacitor is formed by etching an annular groove in the conductive layer. First spacers are formed on the sidewalls of the groove. The conductive layer is anisotrophically etched using the first spacer as an etch mask thus forming an annular ridge around the area where the electrode will be formed. The first spaces are then removed. Second and third spacers are then formed on the both sidewalls of the annular ridge. Again, the conductive layer is anisotrophically etched using the second/third spacers as an etch mask thus forming an annular second groove and an annular second ridge in the remaining conductive layer. The second and third spacers are then removed. Next, fourth, fifth, and sixth spacers are formed on the sidewalls of the second groove and second ridge. The conductive layer is anisotropically etched using the fourth, fifth and sixth spacers as an etch mask thus forming a triple crown electrode from the remaining conductive layer. Also, the etch removes all the polysilicon under the groove thereby separating the adjacent electrodes. A capacitor dielectric layer and a top plate electrode layer are formed over the crown electrodes to complete the capacitor.

Moreover, by repeating the process of the current invention of using spacers in annular grooves and ridges, the invention can be used to form four or more multi-crown electrodes.

In slightly more detail, the present invention provides a method of fabricating a double crown shaped capacitor for a semiconductor memory device including a semiconductor substrate having a multi-layer gate and insulation structure formed thereon, comprising the steps of forming a first conductive layer on the multi-layer gate and insulation structure, the first conductive layer including a portion extending through a contact hole provided in the gate and insulation structure to thereby electrically connect the first conductive layer with an active region of a transistor formed in the semiconductor substrate; forming a groove in the first conductive layer defining areas for a plurality of spatially separated electrodes on the first conductive layer; the groove formed between the adjacent areas; the groove having vertical sidewalls and having a depth less than the thickness of the first conductive layer; forming first spacers on the sidewalls of the groove; anisotropically etching an upper portion of the first conductive layer using the first spacer as an etching mask, thereby forming an upright annular ridge within each the area; the etching removing a thickness of the first conductive layer less than the entire thickness of the first conductive layer; removing the first spacer; forming second and third non-contiguous spacers on opposite sides of the annular ridge; anisotropically etching the first and the second conductive layers using the second and the third spacers as an etch mask thereby forming inner and outer electrodes; the etch exposing the insulation structure under the groove; removing the second and the third spacers; coveting at least the inner and outer electrodes, the first conductive layer and the exposed insulation structure with a conformal dielectric layer; and forming a top plate electrode over the conformal dielectric layer.

DETAILED DESCRIPTION OF THE PREFERRED EMBODIMENTS

Figure 1:
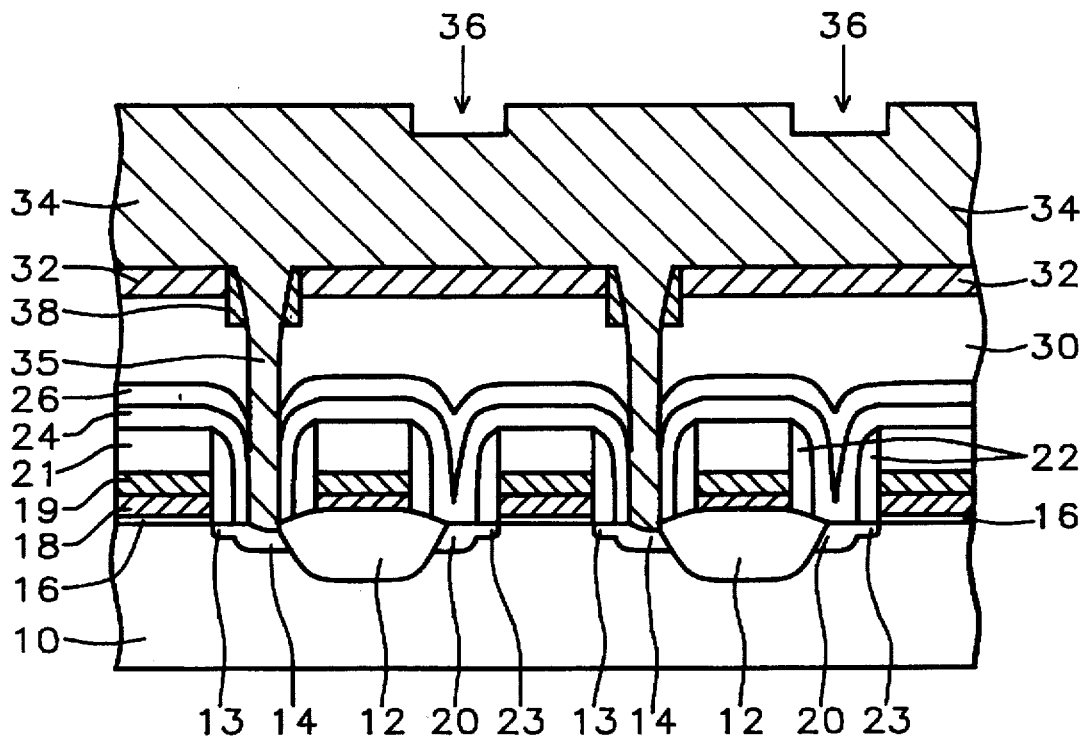
FIGS. 1 through 7 are cross sectional views for illustrating a first embodiment for a method for manufacturing a double cylindrical capacitor of a semiconductor memory device according to the present invention.

Now in keeping with the objectives of this invention, the method for forming a DRAM storage capacitor having a double, triple or more multi-cylindrical electrode is described in detail. The sequence of fabrication steps for a double crown electrode is shown in FIGS. 1 through 7. The method of fabricating a triple crown electrode is shown in FIGS. 1 though 4 and FIGS. 7 through 12. The process for forming the field oxide and the field effect transistor structure as present practiced in manufacturing DRAM cells are only briefly described in order to better understand the current invention. It should be well understood by one skilled in the art that by including additional process steps not described in this embodiment, other types of devices can also be included on the DRAM chip. For example, P wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips. Also, the capacitor can be any shape, such as circular, rectangular, square or irregular, depending on the application. Moreover, multi-walled crown capacitors can be formed with more than three crown walls by using the processes of the invention of forming sidewall spacers on ridges and grooves.

Embodiment 1

Double Cylindrical Capacitor

Referring now to FIG. 1, a cross-sectional view of the substrate 10 having a partially completed DRAM cell formed on the substrate surface, is schematically shown. A field oxide layer 12 is formed on a semiconductor substrate 10 for defining active regions and isolation regions. The preferred substrate is composed of a P-type single crystal silicon having a (100) crystallographic orientation. A relatively thick field oxide (FOX) 12 is formed around the active device areas to electrically isolate these areas. This field oxide is formed by masking the active device areas with a thick silicon oxide (pad oxide) and a thicker silicon nitride layer which forms an oxidation barrier. The silicon substrate is then oxidized in an oxidizing ambient to form the field oxide. The preferred thickness being in the range of about 4000 to 6000 Å.

The semiconductor device is then formed in the active device area after removing the silicon nitride barrier layer and the pad oxide in a convention wet etch. The most commonly used device for dynamic random access memory is MOSFET. This device is formed by first thermally oxidizing the active device area to form a thin gate oxide 16. The preferred thickness being from about 90 to 200 Å.

An appropriately doped polysilicon layer, a tungsten silicide layer, and an insulating layer are deposited on substrate 10 and conventionally photolithographic—etching techniques are used to pattern the polysilicon layer 18, tungsten silicide layer 19, and the insulating layer 21. This patterning forms the gate electrode 16, 18, 19, 21 of the MOSFET in the active device areas and conductive patterns elsewhere on the substrate having an insulting layer thereon. Portions of the conductive patterns form the word lines that electrically connect the MOSFET gate electrode to the appropriate peripheral circuits on the DRAM chip. The lightly doped source drain 14 20 of the N-channel MOSFET is formed next, usually by implanting an N-type atomic species, such as arsenic or phosphorus through the spaces between the gate electrodes 18 19 21. For example, a typical implant might consist of phosphorus P31 at a dose of between about 1E13 and 10E13 atoms/cm$^2$ and at an energy between about 30 and 80 Kev.

After forming the lightly doped source/drain 13 23, sidewall spacers 22 are formed on the gate electrode sidewalls. These sidewall spacers 22 are formed by depositing a low temperature silicon oxide and anisotropically etching back to the silicon surface. For example, the silicon oxide could be a chemical vapor deposition using tetraethoxysilane (TEOS) at a temperature in the range of about 650° to 900° C. and the etch back performed in a low pressure reactive ion etcher.

The source/drain regions 14 20 of the MOSFET are now implanted between the spacers 22 with a N type atomic species, for example, arsenic (As75), to complete the source/drain 14 20. The implantation is usually done through a thin layer of silicon oxide of about 200 to 300 Å in thickness to minimize implant channeling and to protect against contamination by metals and other impurities. A typical implantation dose being between about 2E15 and 1E16 atoms/cm$^2$ and an energy of between about 20 and 70 Kev.

Following this, a first conformal insulating layer 24 is formed over the substrate surface that contacts the source and drain areas 14 20. The conformal insulating layer 24 is can be formed of silicon nitride or silicon oxide and is preferably formed of silicon oxide. A silicon oxide layer 24 can be formed by a low temperature Tetraethylorthosilicate (TEOS) process. The first conformal layer 24 preferably has a thickness in the range between about 1000 and 2000 Å.

A second conformal insulation layer 26 is formed over the conformal insulating layer 24. The second conformal insulation layer 26 can be formed of silicon nitride and silicon oxide. The second insulation layer 26 is preferably formed of silicon oxide preferably by a low temperature chemical vapor deposition using tetraethoxysilane (TEOS). The layer 26 has a thickness in the range between about 500 and 5000 Å. Metal layers and patterns, such as tungsten silicide bit lines (not shown) can be formed over insulating layers 24 and 26.

A planarizing first insulation layer 30 is formed over the conformal insulation layer 26. The first insulation layer 30 can be formed of spin-on-glass (SOG), silicon oxide, and borophosphosilicate glass (BPSG). The first insulation layer 30 is preferably formed of a borophosphosilicate glass. A dielectric layer 30, such as borophosphosilicate glass, can be formed by low pressure chemical vapor deposition (LPCVD) using tetraethylorthosilicate (TEOS) as a reactant. Boron and phosphorus are added to the ambient during the formation of the borophosphosilicate glass layer. The BPSG insulation layer 30 is thermally treated at a temperature of 850° C. for 30 minutes to cause flow and planarization. The first insulating layer 30 can have a thickness in the range between about 3000 and 5000 Å and more preferably a thickness of about 4000 Å.

The remainder of this embodiment relates more specifically to those objects of the invention, which relate to the formation of the multiple crown shaped storage capacitor having increased capacitance and also providing a more manufacturable process. The capacitor structure is formed having a vertical crown first electrode which can have any number of shapes comprising cylindrical, rectangular, triangular or irregular depending on the application. A first conductive layer 32 is formed over the first insulation layer 30. The first conductive layer 32 can be formed of in situ doped polysilicon material. The first conductive layer is preferably composed of polysilicon formed using a LPCVD reactor at a process temperature of between about 550° and 650° C. The polysilicon layer 32 can be doped N-type by ion implantation using, for example, arsenic ions and having an implant dose of between about 1E15 and 20E15 atoms/cm$^2$ and an ion energy of between about 20 and 80 Kev. The first conductive layer can have a dopant concentration in the range of between about 1E20 and 1E22 atoms/cm$^3$ and preferably a concentration of about 10E21 atoms/cm$^3$. Alternatively, the polysilicon layer can be doped in sire during the polysilicon deposition. The first conductive layer 32 preferably has a thickness in the range between about 2000 and 4000 Å and more preferably a thickness of about 3000Å.

As a beginning step in forming electrode contacts to the sources 14 (e.g., node contact), a contact opening is formed over the sources 14 through the first conductive layer 32 and through an upper portion of the first insulation layer 30. The opening can have a depth in the range between about 0.1 and 0.2 µm and a width in the range of between about 0.4 and 1.0 µm. The opening can by formed by conventional photolithographic techniques.

Optional sidewall spacers 38 are formed on the sidewalls of the first conductive layer 32 and first insulation layer 30 in the opening. The sidewall spacers 38 can be formed of oxide, silicon nitride and polysilicon material. The sidewall spacers are preferably formed of polysilicon. The sidewall spacers have a thickness in the range between about 500 to 1500 Å. The sidewall spacers reduce the contact size and increase the overlay margin. The sidewall spacers 38 can be doped with an impurity such as arsenic, to an impurity in the range of between about 1E20 and 1E22 atoms/cm$^3$.

After this, a contact hole for connecting the storage electrode with the source region 14 is formed by removing the materials over the source (e.g. through the first insulation layer 30 and the underlying layers over the source 14) as shown in FIG. 1. If spacers are used, an etch forms the contact hole by using the spacers are a mask. The hole can be formed by using an anisotropic etch. The hole is opened down to expose the active areas 14.

Next, a second conductive layer 34 is formed over the first conductive layer and filling the contact hole thus forming a contact 35 to the a source/drain 14. The second conductive layer can be formed of polysilicon material. The polysilicon second conductive layer can be implanted with Arsenic with a dose in the range between about 1E20 to 1E22 and an energy between 30 and 45 keV thus giving the second conductive layer 34 a concentration in the range between about 1E20 to 1E22 atoms/cm$^3$. The second conductive layer preferably has a thickness in the range between about 5000 to 10,000 Å and more preferably a thickness of about 8000 Å.

A first photoresist mask (not shown) is formed over the second conductive layer 34 thus forming a pattern for defining areas for individual cell units on the second conductive layer. Upper portions of the second conductive layer 34 are etched through the first photoresist mask forming an groove 36 in the second conductive layer 34. The groove 36 has vertical sidewalls. The groove preferably has a depth in the range between about 500 to 2000 Å and more preferably about 1000 Å. The groove 36 preferably has a width in the range between about 0.4 to 1.0 μm and more preferably about 0.6 μm. Next, the first photoresist mask is removed.

Figure 2:
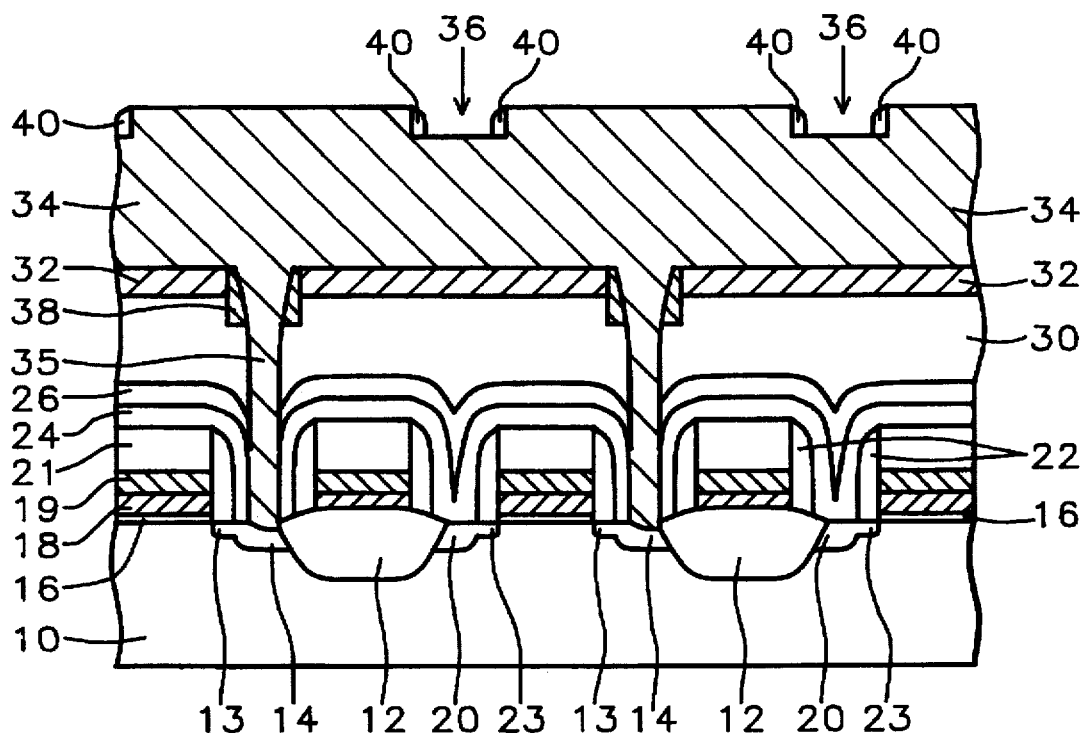

As shown in FIG. 2, first spacers 40 are then formed on the sidewalls of the groove 36. The first spacers 40 can be formed of silicon oxide or silicon nitride. The silicon oxide first spacers are preferably fabricated by forming a conformal silicon oxide layer over the substrate surface. The conformal layer is preferably a silicon oxide layer formed using a chemical vapor deposition process using Tetraethylorthosilicate (TEOS). Then the conformal silicon oxide layer is then anisotropically etched to form the spacers 40. The first spacers 40 preferably have a width in the range between about 0.05 to 0.2 μm and more preferably have a width of about 0.1 μm.

Figures 3, 4:
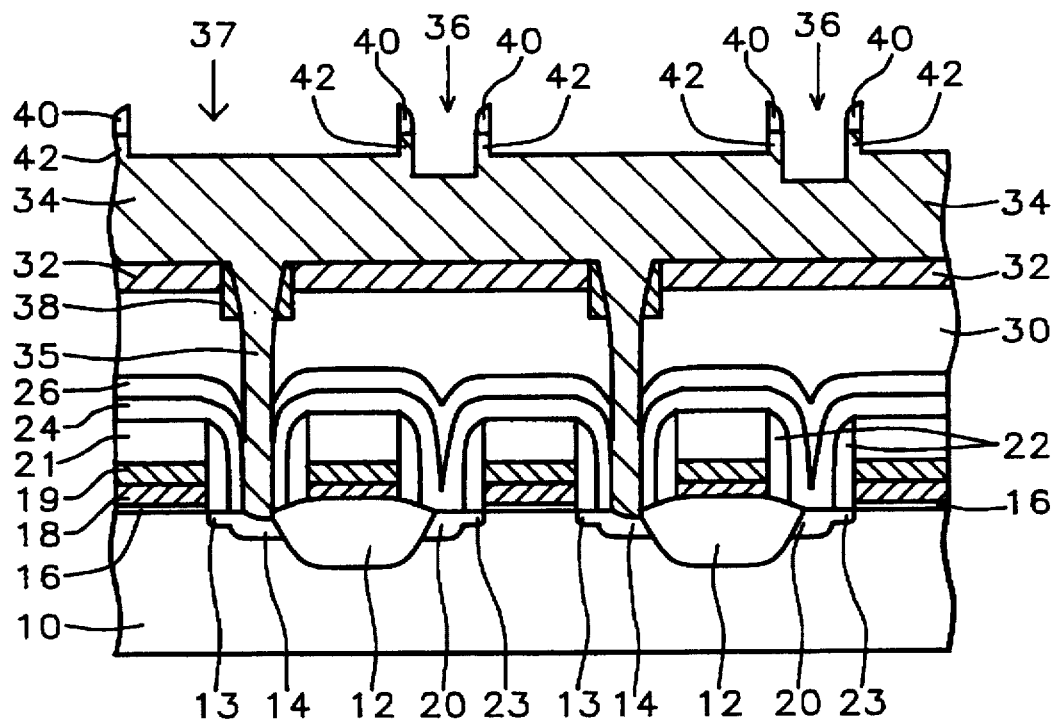

Now turning to FIG. 3, upper portions of the first conductive layer are anisotropically etched using the first spacers 40 as an etching mask, thereby forming a plurality of first upright extending portions (e.g., first ridges) 42 within each the area for individual cell units (i.e., area for the individual electrodes). The etching removes a thickness of the first conductive layer less than the entire thickness of the first conductive layer and forms a central hollow 37 and deepens groove 36. The anisotropic etch into the first conductive layer 34 consumes between about 1000 to 3000 Å of the first conductive layer 34 and more preferably about 2000 Å. The first ridges 42 (e.g., narrow raised strips) have a width approximately equal to the width of the first spacers 42. The upright annular ridge can have any shape, such as square, rectangular, circular, and irregular, depending on the application. The first spacers 40 are then removed.

As shown in FIG. 4, second (inner) 46 and third (outer) 48 spacers are formed on opposite sides of each annular ridge 42. To accomplish this, a conformal layer is formed on the substrate surface and anisotropically etched to form the second and third spacers 46 48. The second spacers and the third spacers 46 48 preferably have a width in the range between about 500 to 2000 Å and more preferably about 1000 Å. The second and third spacers 46 48 can be formed of silicon nitride and silicon oxide. The spacers are preferably formed of silicon oxide using Tetraethylorthosilicate (TEOS).

Figure 5:
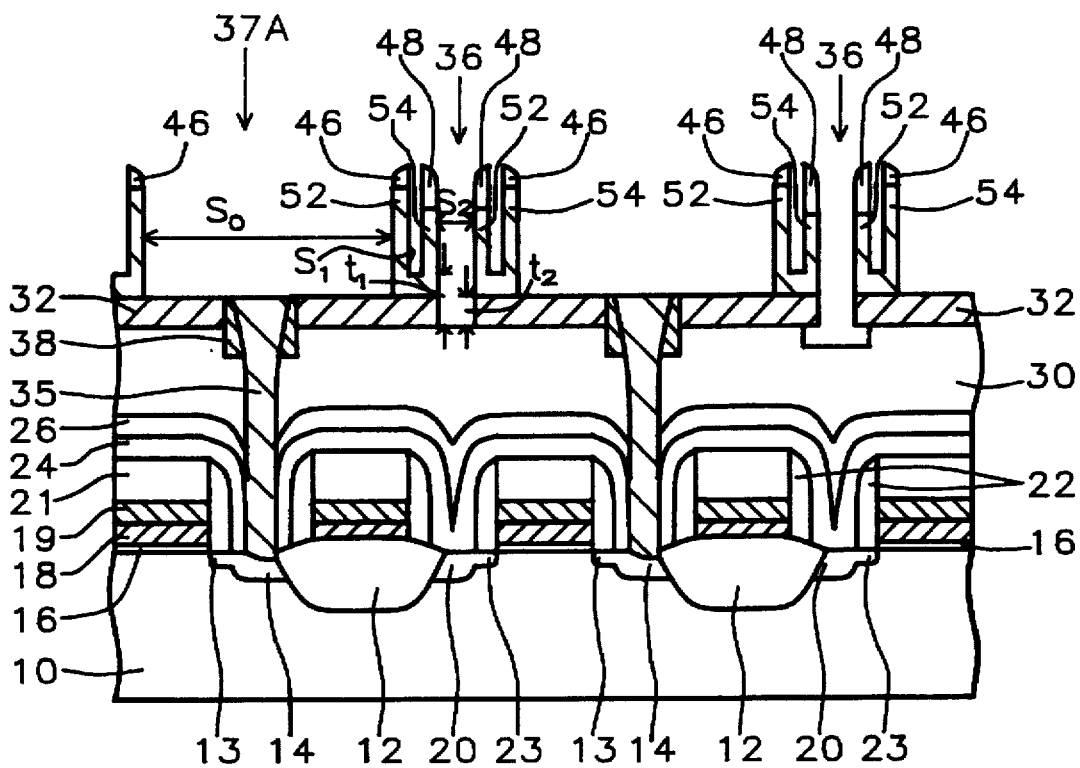

As shown in FIG. 5, the first and the second conductive layers 32 34 are anisotropically etched using the second 46 (inner) and the third 48 spacers (outer) as an etch mask thereby forming inner 52 and outer 54 upright extending portions of the second conductive layer (e.g., electrodes). The etch also exposes the first insulation layer 30 under the groove 36 thus separating adjacent electrodes. The etch preferably at least exposes the portion of the first conductive layer 34 in the central hollow 37A between the inner electrodes 52. The etch preferably does not expose the first conductive layer 32 in the area between the inner 52 and the outer 54 electrodes.

The second and spacers 46 48 are then removed. The spacers can be removed with a wet-etch using a buffered oxide etchant (BOE) or a diluted HF solution. As shown in FIG. 5, the thickness $t_1$ of the remaining second and first conductive layers between the inner and outer electrodes 52 and 54 is preferably between about 500 to 2000 Å and $t_1$ is preferably about 1000 Å. The first conductive layer can have a thickness $t_2$ in the range of between about 1500 and 2000 Å. The spacing $S_0$ between the inner electrodes 52 is preferably in the range of between about 0.4 and 1.0 μm and more preferably about 0.6 μm. The spacing $S_1$ between the inner electrode 52 and the outer electrode 54 is preferably in the range of between about 250 and 1000 Å and more preferably about 500 μm. The spacing $S_2$ between adjacent outer electrodes 54 is preferably in the range of between about 0.05 and 0.2 μm and more preferably about 0.1 μm.

Figure 6:
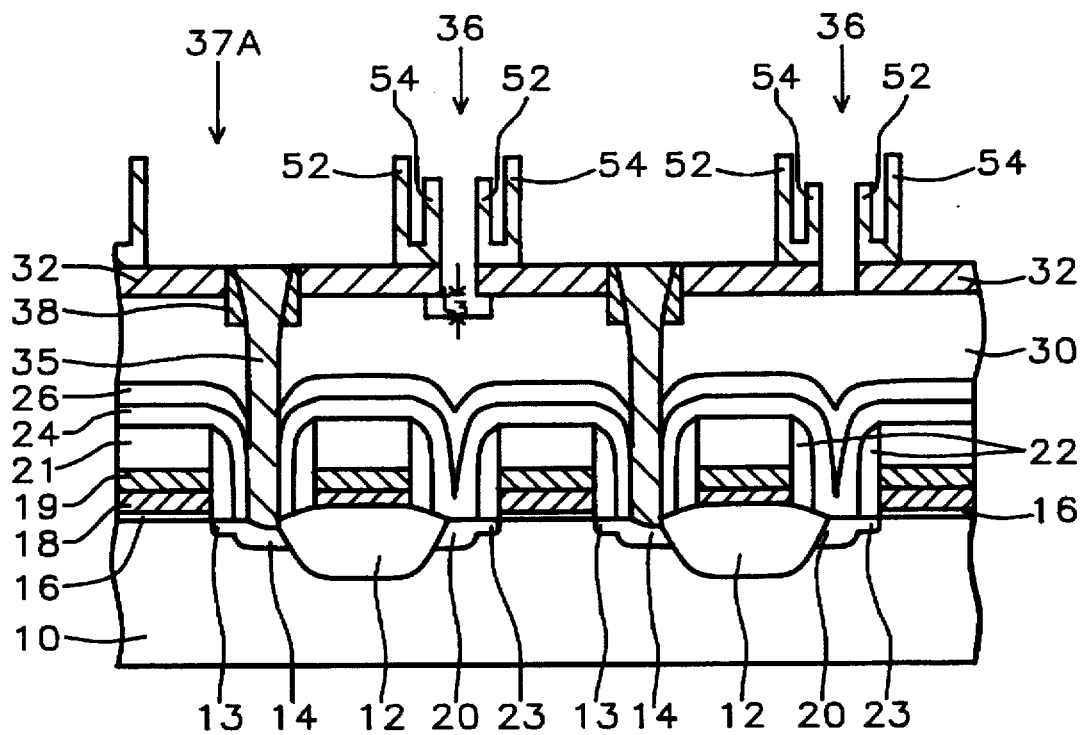

As shown in FIG. 6, an etch removes the spacers 46 48 and the first insulation layer 30 under the groove 36. The first insulation layer is simultaneously etched using the remaining first and second conductive layers 32 34 as an etch mask. The etch can be an isotropic etch using buffered oxide etch. The etch preferably removes a thickness $t_3$ between about 500 to 1000 Å of the first insulation layer 30.

Figure 6A:
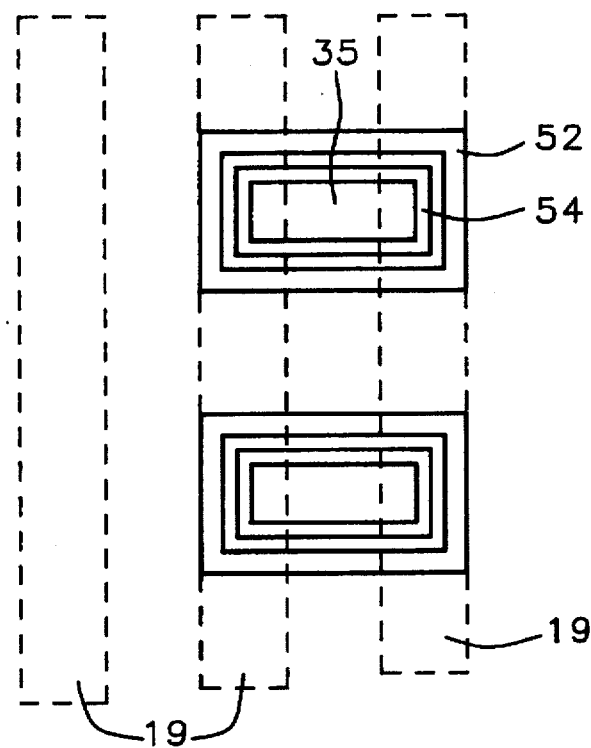
FIG. 6A is a top plan view for illustrating a first embodiment for a method for manufacturing a double cylindrical capacitor of a semiconductor memory device according to the present invention.

FIG. 6A shows a top down view of the double crown electrode at the point in fabrication shown in FIG. 6 where the double crown electrode 34 52 54 has been formed. The figure shows a preferred embodiment of the invention where the double crown electrode has a rectangular shape. The electrode of the invention can have any shape depending on the specific application.

Figure 7:
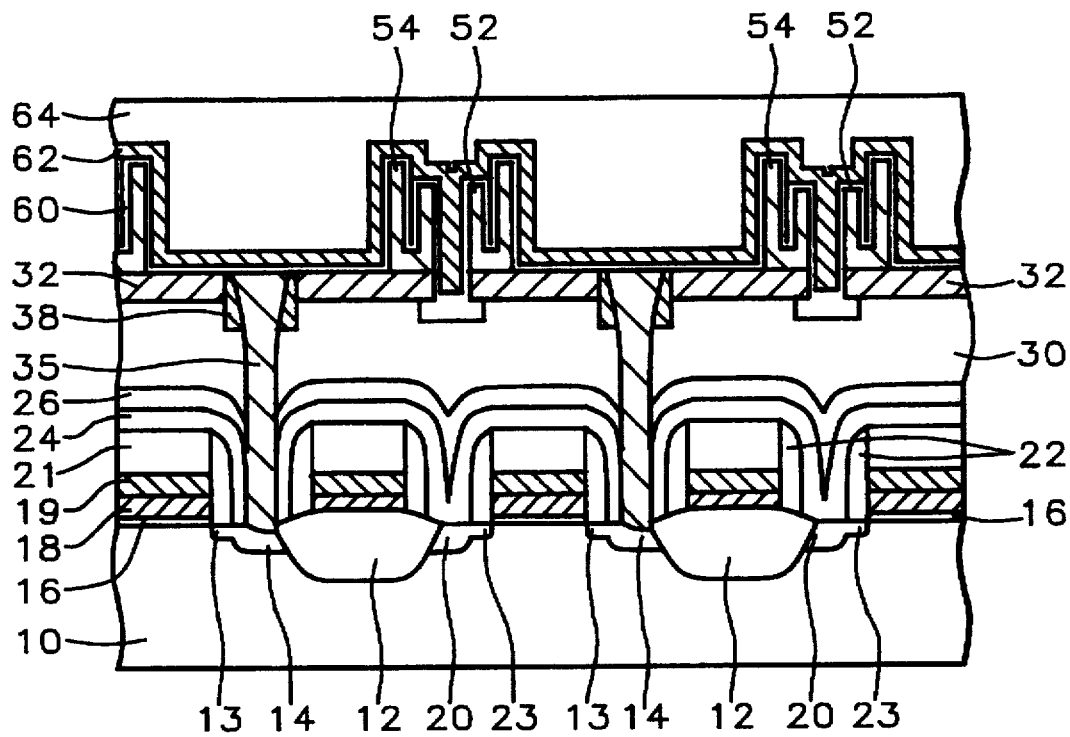

At least the inner and outer electrodes 52 54, the first conductive layer 32 and the first insulation layer 30 are covered with a conformal dielectric layer 60 as shown in FIG. 7. The material of the dielectric layer 60 can be any suitable material having a high dielectric constant, being continuous, and pinhole free. The conformal dielectric layer can be formed of silicon nitride, an oxide/nitride (ON) film, an oxide/nitride/oxide (ONO) film, tantalum pentoxide ($Ta_2O_5$), and silicon oxide material. Preferably, the conformal dielectric layer is formed of an Oxide/Nitride film. The conformal dielectric layer 60 preferably has a thickness in the range between about 45 to 60 Å and more preferably about 50 Å.

As shown in FIG. 7, a top plate electrode 62 is formed over the capacitor dielectric layer 60. The top plates of adjacent capacitors are electrically connected. The top plate electrode is preferably formed a polycrystalline silicon doped with an impurity. The top plate electrode preferably has a thickness in the range between about 500 to 2000 Å and more preferably a thickness of about 1000 Å. The top plate electrode preferably has an impurity concentration in the range of between about 1E20 and 1E22 atoms/cm$^3$ and more preferably about 1E21 atoms/cm$^3$.

Lastly, a top capping insulating layer 64 is formed over the top plate 60. The top insulating layer can have a thickness in the range of between about 4000 and 6000 Å and a thickness more preferably about 4500 Å. The top insulation layer 64 can be formed of BPSG and silicon oxide materials.

Figure 7A:
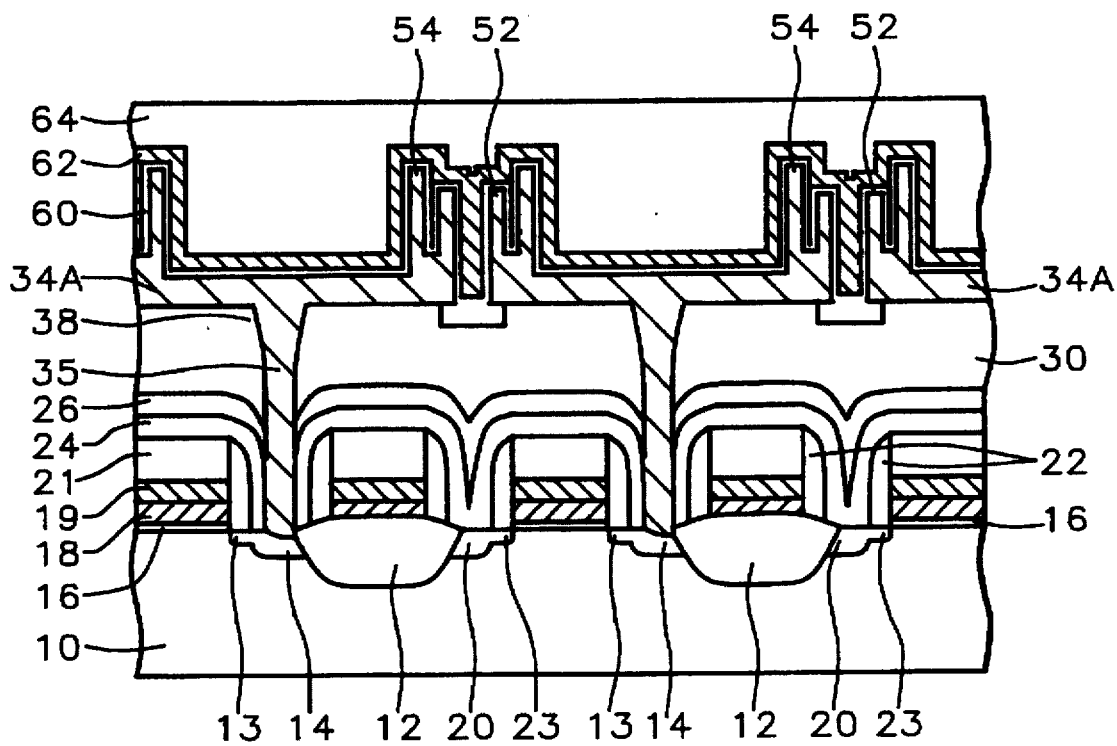
FIG. 7A is a cross sectional view for illustrating another embodiment for a method for manufacturing a double cylindrical capacitor of a semiconductor memory device according to the present invention where the electrode is formed of only one conductive layer.

FIG. 7A shows another embodiment of the current invention where only one conductive layer 34A is formed over the first isolation layer 26 and also fills the contact hole to form an electrical connection 35 to the active areas 13 14. (A conductive layer 32 is not formed). The process to form the crown capacitor is the same as describe previously where the conductive layer 34A functions as both the first 32 and second conductive layers 34. The conductive layer 34A in this embodiment can have a thickness in the range of between about 7000 and 14,000 Å and more preferably about 11,000 Å.

Embodiment 2

Multi-walled capacitor

FIGS. 8 through 12 and 12A are cross sectional second views illustrating a second embodiment of a method for manufacturing a triple walled crown capacitor. Basically, after the processes shown in FIGS. 1 to 4 are performed, the processes of the invention as shown in FIGS. 8 through 13 form a triple-walled cylindrical capacitor. This process of forming multiple crown electrodes is basically repeating the sub-processes of the invention of spacer formation on ridge sidewalls and etching the conducting layer to form electrodes under the spacers.

Figure 8:
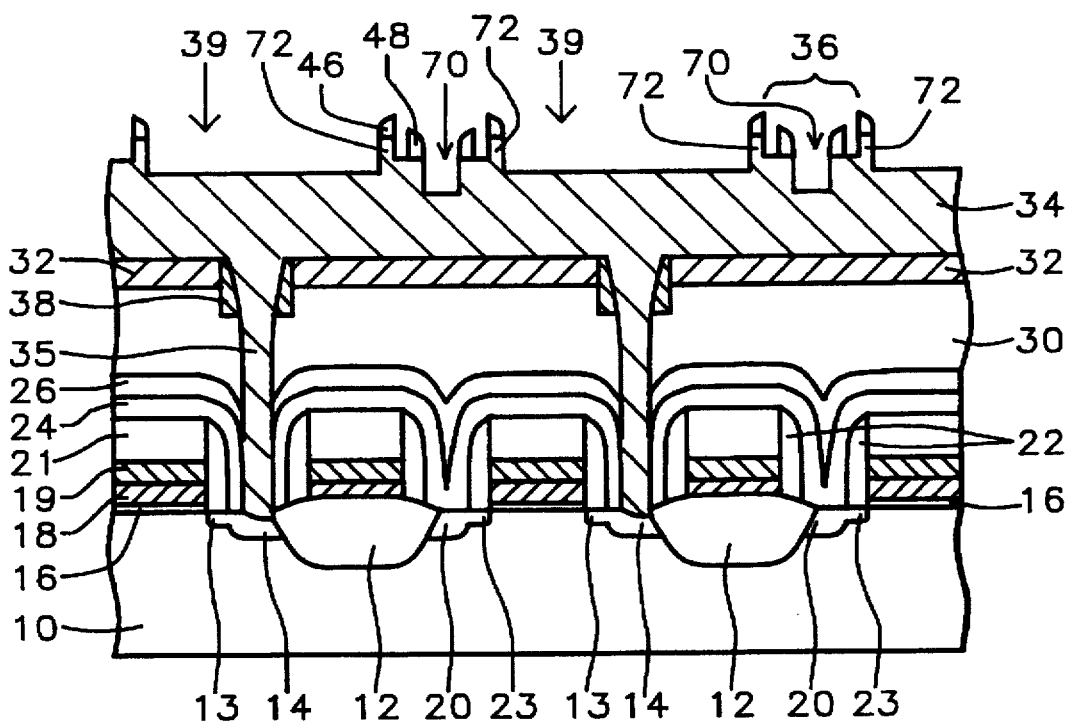
FIGS. 8 through 12 are cross sectional views for illustrating a second embodiment for a method for manufacturing a triple-cylindrical capacitor of a semiconductor memory device according to the present invention.

This second embodiment is performed in the similar manner as in the first embodiment up until the second and third spacers 46 48 are formed as shown in FIG. 4. The second conductive layer 34 preferably has a thickness in the range of between about 8000 and 10,000 Å. After that, as shown in FIG. 8, the second conductive layer is anisotropically etched using the second and the third spacers as an etch mask thereby forming a second annular ridge 72 and a second annular groove 70. The anisotropic etch preferably consumes a thickness of the second conductive layer 34 in the range of between about 2000 and 6000 Å and more preferably about 3000 Å thus forming a central hollow 39. The ridge 72 preferably has a height in the range of between about 2000 and 4000 Å and more preferably about 3000 Å and the ridge 72 has a width preferably in the range of between about 0.05 and 0.3 µm and more preferably about 0.1 µm. The groove 70 preferably has a depth in the range of between about 2000 and 4000 Å and more preferably about 3000 Å and the groove 70 preferably has a width (between adjacent electrodes as shown in FIG. 8) in the range of between about 0.2 and 0.5 µm and more preferably about 0.3 µm.

Figure 9:
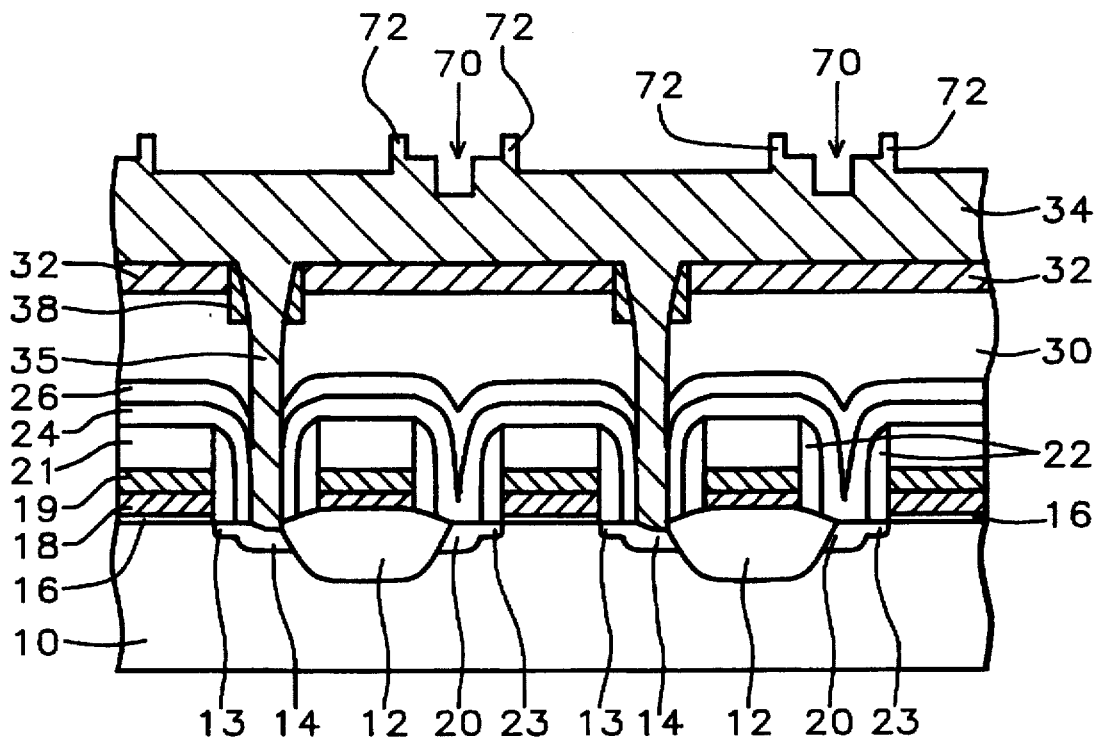

Next, the second and third spacers 46 48 are removed as shown in FIG. 9. The spacers 46 48 can be removed with an etch composed of buffered HF.

Figure 10:
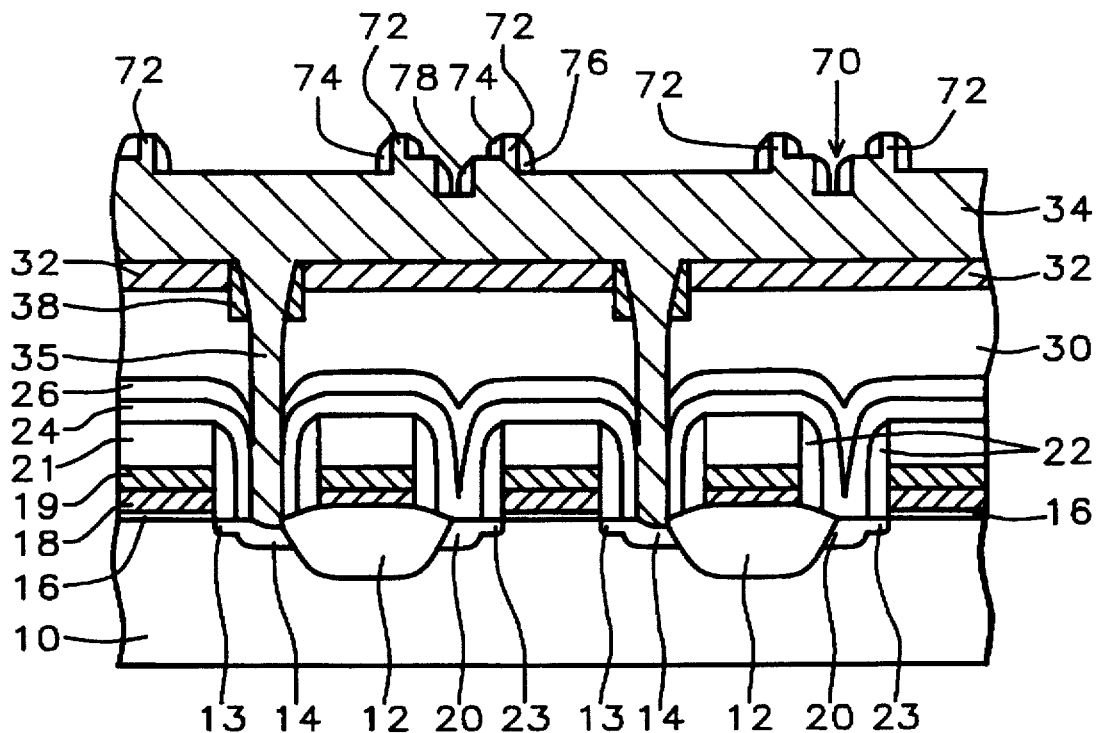

As shown in FIG. 10, fourth and fifth spacers 74 76 are formed on the sidewall of the second ridge 72 and sixth spacers 78 are formed on the sidewalls of the second groove 70. The fourth, fifth and sixth spacers (like the other spacers) can be formed of any material with a different etch rate than the first and second conductive layers. The fourth, fifth and sixth spacers are preferably formed of silicon oxide and silicon nitride. The spacers are more preferably formed of silicon oxide. This is accomplished by forming a conformal layer (not shown) of silicon oxide on the substrate surface and anisotropically etching the layer. The fourth, fifth, and sixth spacers 74 76 78 have a width in the range of between about 500 and 1500 Å and more preferably about 1000 Å.

Figure 11:
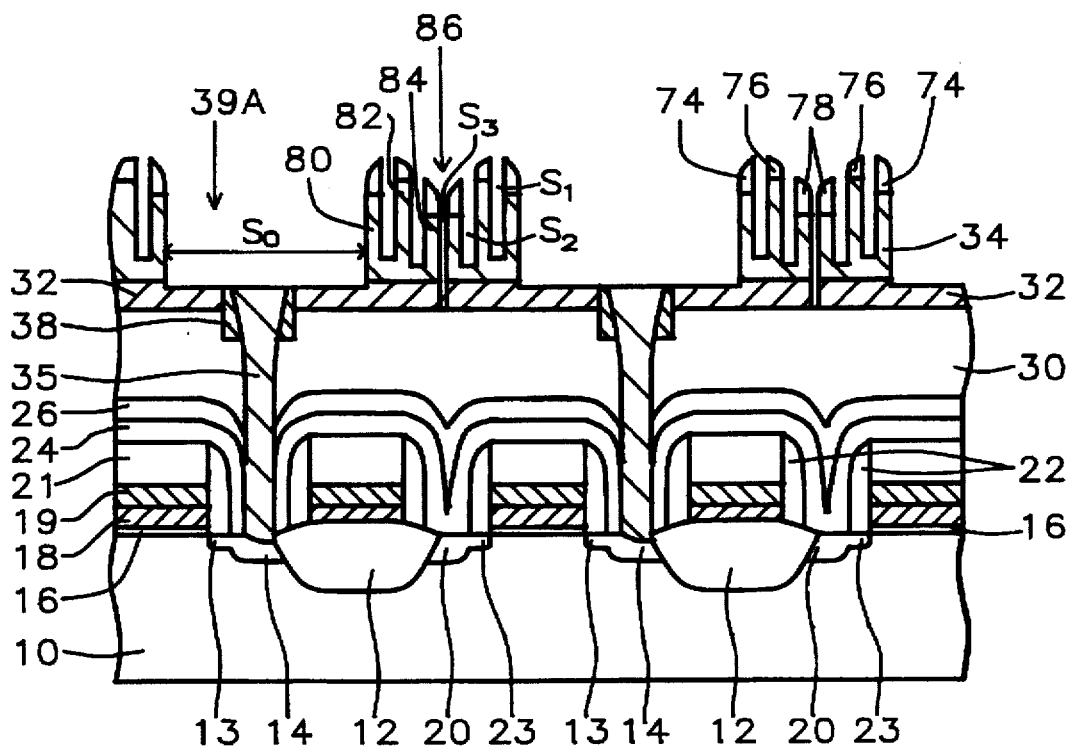

Turning to FIG. 11, the first and the second conductive layers 32 34 are then anisotropically etched using the fourth, fifth, and sixth spacers 74 76 78 as an etch mask thereby forming an inner 80, a middle 82, and an outer 84 cylindrical electrodes from the second conductive layer 34. The etch forms an opening 86 between adjacent outer electrodes 84 which exposes a portion of the first insulation layer 32 between the inner electrodes 80. The etch also deepens the hollow 39A between the inner electrodes and preferably exposes the first conductive layer 32. In addition, the etch preferably does not expose the first conductive layer 32 in the area between the inner 82 and the outer 84 electrodes.

As shown in FIG. 11, the spacing ($S_0$) between the inner electrodes is preferably in the range of between about 0.2 and 0.6 µm and more preferably about 0.3 µm. The spacing between the inner electrode and the middle electrode ($S_1$) is preferably in the range of between about 0.05 and 0.2 µm and more preferable about 0.1 µm. Also, the spacing between the middle electrode and the outer electrode ($S_2$) is preferably in the range of between about 0.05 and 0.2 µm and more preferably about 0.1 um. The spacing between the outer electrode ($S_3$) of adjacent cells is preferable in the range of between about 0.05 and 0.2 µm and more preferably about 0.1 µm.

Furthermore, the width of the inner electrode 80 is preferably in the range of between about 0.05 and 0.2 µm and more preferably about 0.2 µm. The width of the middle electrode 82 is preferably in the range of between about 0.05 and 0.2 µm and more preferably about 0.1 µm. Also, the width of the outer electrode 84 is preferably in the range of between about 0.05 and 0.2 µm and more preferably about 0.1 µm.

Figure 12:
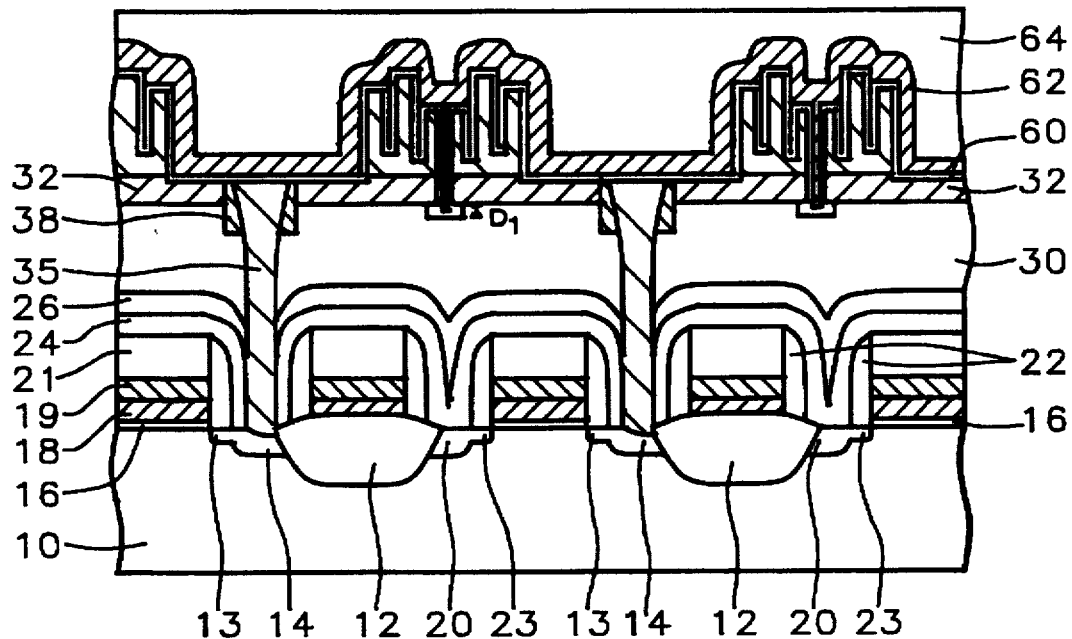

Referring to FIG. 12, the fourth, fifth and sixth spacers 74 76 78 are then removed by an etch process. The first insulation layer is also etched 30 under the second groove 70 using the first and second conductive layers as an etch mask. The etch removes a thickness $D_1$ of the first insulation layer 30 preferably between about 1000 to 2000 Å.

FIG. 12 illustrates the step where at least the inner, middle, and outer electrodes 74 76 78, the first conductive layer 32 and the first insulation layer 30 are covered with a conformal dielectric layer 60. The conformal dielectric layer can be formed of silicon nitride, $Ta_2O_5$, oxide/nitride, silicon nitride, and silicon oxide material. Preferably, the conformal dielectric layer is formed of Silicon oxide/nitride (ON). The conformal dielectric layer 60 preferably has at thickness in the range between about 40 and 60 Å and more preferably about 50 Å.

Subsequently, a top plate electrode 62 is formed over the capacitor dielectric layer. The top plate electrode is preferably formed of a doped polysilicon film. The top plate electrode preferably has a thickness in the range between about 500 to 2000 Å and more preferably a thickness of about 1000 Å. The top plates electrically connect to the top plate of adjacent capacitors as shown in FIG. 12.

Figure 12A:
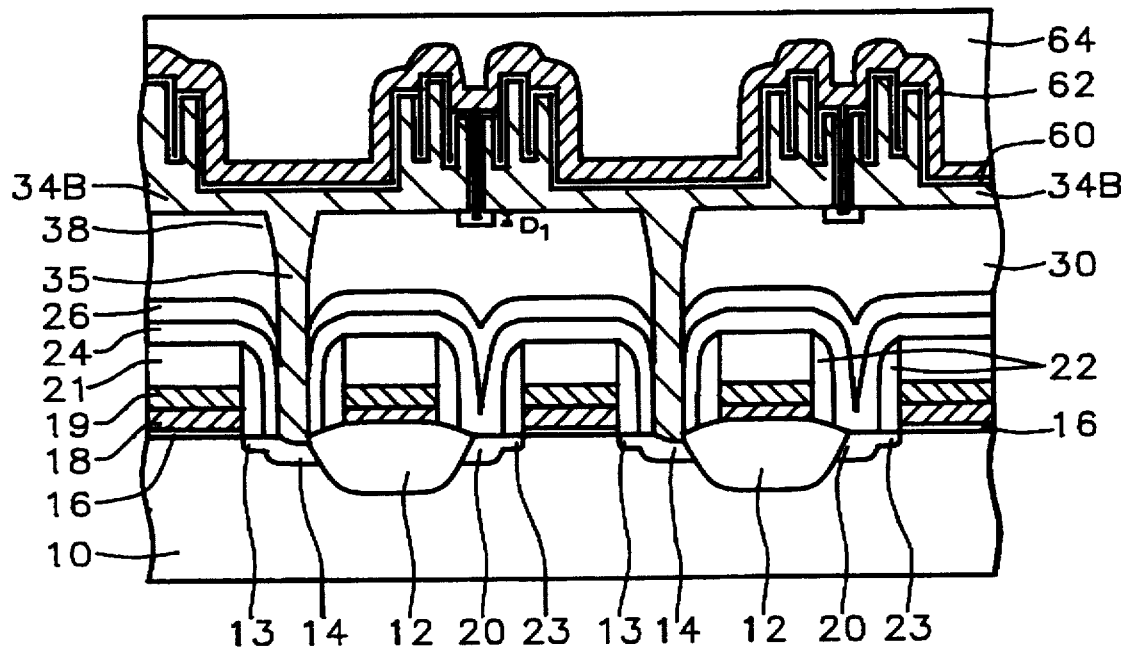
FIG. 12A is a cross sectional view for illustrating another embodiment for a method for manufacturing a triple-crown capacitor of a semiconductor memory device according to the present invention where the electrode is formed of only one conductive layer.

FIG. 12A shows another embodiment of the current invention where only one conductive layer 34A is formed over the first isolation layer 26 and also fills the contact hole to form an electrical connection 35 to the active areas 13 14. (Both first and second conductive layers 32 42 are not formed). The process to form the single crown capacitor is the same as describe previously where the conductive layer 34A functions as both the first 32 and second conductive layers 34 previously described. The conductive layer 34B in this embodiment can have a thickness in the range of between about 10,000 and 14,000 Å and more preferably about 12,000 Å.

The process of the invention can be applied to form any number of crown wall electrodes and is only limited by process capability. The process of forming spacers on the sidewalls of spaced ridges and grooves can be repeated to obtain the desired number of crown electrodes. For example, the method of the current invention can be used to form a four walled crown electrode.

According to the present invention, a storage electrodes of a capacitor can be obtained form a single conductive layer 34A. See FIGS. 7A 12A. This makes the electrodes stronger and more stable. The ability to form a double or a triple or more multi-walled cylindrical capacitor using sidewall spacers to define the electrodes improves the layout precision thus allowing a more compact capacitor while maximizing the capacitance of the electrodes. The process of the invention of forming grooves and sidewall spacers provides a simple and inexpensive method of reliable, high capacitance capacitors.

The method of the present invention uses fewer process steps than the prior art processes to form a multi crown capacitor. An important feature of this invention is the dual function of the groove. First, the groove is formed in areas where the polysilicon will be removed in the etch step. Second, the sidewalls of the groove 36 are used to form spacers 40 which are used as a mask in an etch step to define the vertical crowns of the electrode. The combination of the groove and the spacers allows the etch step to define both the annular ridges and deepen the groove between the adjacent electrodes. This groove-sidewall spacer-etch process, reduces the number of process steps, reduces process complexity, increases process tolerance, and reduces manufacturing costs.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a double crown capacitor for a semiconductor memory device in a semiconductor substrate in areas for a memory cell unit; said memory device having a source, a drain, and a gate element; which comprises the steps of:

forming a first insulation layer over the substrate surface;

forming a first conductive layer on said first insulation layer; said first conductive layer has a thickness in the range between about 2000 and 3000 Å and said first conductive layer is formed of polysilicon;

forming a contact hole through at least said first conductive layer and said first insulation layer over said source that exposes said source;

forming a second conductive layer over said first conductive layer and filling said contact hole thereby forming a contact to said source; said second conductive layer has a thickness in the range between about 8000 and 10,000 Å and said second conductive layer is formed of doped polysilicon;

forming a first photoresist mask forming a pattern for defining areas for a memory cell unit on said second conductive layer;

etching upper portions of said second conductive layer through said first photoresist mask forming an groove in said second conductive layer; said groove having vertical sidewalls; said groove has a depth in the range between about 1000 and 2000 Å;

removing said first photoresist mask;

forming a first spacer on said annular sidewalls of said groove; said first spacers have a width in the range between about 0.05 and 0.2 μm, and said first spacers are formed a material selected from the group consisting of silicon oxide and silicon nitride;

anisotropically etching an upper portion of said second conductive layer using said first spacer as an etching mask, thereby forming an upright annular ridge within each said area for said cell unit; said etching removing a thickness of said second conductive layer less than the entire thickness of said second conductive layer; said anisotropic etch into said first conductive layer consumes between about 1000 to 3000 Å of said first conductive layer;

removing said first spacer;

forming second and third non-contiguous spacers on opposite sides of said annular ridge; said second spacers and said third spacers have a width in the range between about 500 and 2000 Å, and said second and third spacers are formed a material selected from the group consisting of silicon oxide and silicon nitride;

anisotropically etching said first and said second conductive layers using said second and said third spacers as an etch mask thereby forming inner and outer electrodes; said anisotropic etch exposing said first insulation layer under said groove;

isotropically etching said first isolation layer in the area under said groove; the isotropic etch removes a thickness ($t_3$) of said first isolation layer between about 500 to 1000 Å of the first insulation layer;

removing said second and said third spacers;

covering at least said inner and outer electrodes, said first conductive layer and said first insulation layer with a conformal dielectric layer; and forming a top plate electrode over said conformal dielectric layer.

2. The method of claim 1 wherein said conformal dielectric layer has a thickness in the range between about 45 and 60 Å and is formed of silicon oxide.

3. The method of claim 1 wherein said top plate electrode has a thickness in the range between about 1000 and 2000 Å and is formed of polycrystalline silicon.

4. The method of claim 1 which wherein said anisotropic etch of said first and second conductive layers forming said inner and outer electrodes; the etch at least exposes a portion of said first conductive layer between said inner electrodes; and said etch not exposing said first conductive layer in the area between said inner and said outer electrodes.

5. A method of fabricating at least one triple crown shaped electrode for a semiconductor memory device including a semiconductor substrate having a multi-layer gate and insulation structure formed thereon, comprising the steps of:

forming a first conductive layer on said multi-layer gate and insulation structure, said first conductive layer including a portion extending through a contact hole provided in the gate and insulation structure to thereby electrically connect said first conductive layer with an active region of a transistor formed in said semiconductor substrate;

forming a groove in said first conductive layer defining areas for a plurality of spatially separated electrodes on said first conductive layer; said groove formed between said adjacent areas; said groove having vertical sidewalls and having a depth less than the thickness of said first conductive layer;

forming first spacers on said sidewalls of said groove;

anisotropically etching an upper portion of said first conductive layer using said first spacer as an etching mask, thereby forming an upright annular ridge within each said area; said etching removing a thickness of said first conductive layer less than the entire thickness of said first conductive layer;

removing said first spacer;

forming second and third spacers on opposite sides of said annular ridge;

anisotropically etching said second conductive layer using said second and said third spacers as an etch mask thereby forming a second annular ridge and a second annular groove;

removing said second and third spacers;

forming fourth and fifth spacers on the said sidewall of said second ridge and sixth spacers on the sidewalls of said second groove;

anisotropically etching said first and said second conductive layers using said fourth, fifth and sixth spacers as an etch mask thereby forming inner, middle, and outer cylindrical electrodes from said second conductive layer; said etch exposing said first insulation layer under said second groove, removing said fourth, fifth and sixth spacers;

etching said first insulation layer under said second groove using said first and second conductive layers as an etch mask; the etch of said first insulation layer removing a thickness of between about 1000 and 2000 Å;

covering at least said inner, middle, and outer electrodes, said first conductive layer and said first insulation layer with a conformal dielectric layer; and forming a top plate electrode over said capacitor dielectric layer; said top plates electrically connecting adjacent capacitors.

6. The method of claim 5 wherein the spacing between the inner electrodes ($S_0$) is in the range of between about 0.2 and 0.6 μm.

7. The method of claim 5 wherein the spacing between the inner electrode and the middle electrode ($S_1$) is in the range of between about 0.05 and 0.2 μm.

8. The method of claim 5 wherein the spacing between said middle electrode and said outer electrode ($S_2$) is in the range of between about 0.05 to 0.2 μm.

9. The method of claim 5 wherein the spacing between said outer electrode ($S_3$) of adjacent electrodes is preferable in the range of between about 0.05 and 0.1 μm.

10. The method of claim 5 wherein the width of said inner electrode in the range of between about 0.05 and 0.2 μm.

11. The method of claim 5 wherein the width of said middle electrode in the range of between about 0.05 and 0.2 μm.

12. The method of claim 5 wherein the width of said outer electrode in the range of between about 0.05 and 0.1 μm.

13. A method of fabricating at least one triple crown shaped electrode for a semiconductor memory device including a semiconductor substrate having a multi-layer gate and insulation structure formed thereon, comprising the steps of:

forming a first conductive layer on said multi-layer gate and insulation structure, said first conductive layer including a portion extending through a contact hole provided in the gate and insulation structure to thereby electrically connect said first conductive layer with an active region of a transistor formed in said semiconductor substrate;

forming a groove in said first conductive layer defining areas for a plurality of spatially separated electrodes on said first conductive layer; said groove formed between said adjacent areas; said groove having vertical sidewalls and having a depth less than the thickness of said first conductive layer;

forming first spacers on said sidewalls of said groove;

anisotropically etching an upper portion of said first conductive layer using said first spacer as an etching mask, thereby forming an upright annular ridge within each said area; said etching removing a thickness of said first conductive layer less than the entire thickness of said first conductive layer;

removing said first spacer;

forming second and third spacers on opposite sides of said annular ridge;

anisotropically etching said second conductive layer using said second and said third spacers as an etch mask thereby forming a second annular ridge and a second annular groove;

removing said second and third spacers;

forming fourth and fifth spacers on the said sidewall of said second ridge and sixth spacers on the sidewalls of said second groove;

anisotropically etching said first and said second conductive layers using said fourth, fifth and sixth spacers as an etch mask thereby forming inner, middle, and outer cylindrical electrodes from said second conductive layer; said etch exposing said first insulation layer under said second groove, the spacing between the inner electrodes ($S_0$) is in the range of between about 0.2 and 0.6 μm; the spacing between the inner electrode and the middle electrode ($S_1$) is in the range of between about 0.05 and 0.2 μm; the spacing between said middle electrode and said outer electrode ($S_2$) is in the range of between about 0.05 to 0.2 μm; the width of said middle electrode in the range of between about 0.05 and 0.2 μm; the width of said inner electrode in the range of between about 0.05 and 0.2 μm; the width of said outer electrode in the range of between about 0.05 and 0.1 μm;

removing said fourth, fifth and sixth spacers;

etching said first insulation layer under said second groove using said first and second conductive layers as an etch mask; the etch of the first insulation layer removing a thickness of between about 1000 and 2000 Å;

covering at least said inner, middle, and outer electrodes, said first conductive layer and said first insulation layer with a conformal dielectric layer; and forming a top plate electrode over said capacitor dielectric layer; said top plates electrically connecting adjacent capacitors; the spacing between said outer electrode ($S_3$) of adjacent electrodes is preferable in the range of between about 0.05 and 0.1 μm.

* * * * *